United States Patent [19]
Uchida et al.

[11] Patent Number: 5,214,026
[45] Date of Patent: May 25, 1993

[54] METHOD FOR PRODUCING A R-CE-CU-O SUPERCONDUCTING MATERIAL WHEREIN R IS AT LEAST ONE RARE EARTH ELEMENT

[75] Inventors: Shinichi Uchida, Fuchu; Yoshinori Tokura, Chofu; Hidenori Takagi, Taito, all of Japan

[73] Assignee: University of Tokyo, Tokyo, Japan

[21] Appl. No.: 899,277

[22] Filed: Jun. 16, 1992

Related U.S. Application Data

[62] Division of Ser. No. 470,011, Jan. 25, 1990, Pat. No. 5,143,895.

[30] Foreign Application Priority Data

Jan. 25, 1989 [JP] Japan ..................................... 1-15549

[51] Int. Cl.$^5$ ........................ C01F 17/00; C01G 3/02; H01L 39/00
[52] U.S. Cl. ........................................ 505/1; 423/604; 505/742
[58] Field of Search ..................... 252/518, 521; 505/1, 505/779, 801, 809, 815, 776, 742; 423/604

[56] References Cited

FOREIGN PATENT DOCUMENTS

WO-A1-88/5029 7/1988 PCT Int'l Appl.

OTHER PUBLICATIONS

Takagi et al, "Superconductivity Produced by Electron Doping in CuO$_2$-Layered Compounds", Physical Review Letters, vol. 62, No. 10, Mar. 6, 1989, pp. 1197–1200.

Takagi et al, "Electron-Doped Superconductivity in CuO$_2$ Layered Compounds with Nd$_2$CuO$_4$-structure", Mat. Res. Soc. Symp. Proc., vol. 156, 1989, pp. 389–395.

Khurana, "Electron Superconductors Challenge Theories, Start a New Race", Physics Today, Apr. 1989, pp. 17–19.

Tsurumi et al, "Appearance of Superconductivity in Tetragonal Nd$_{1.5}$Ba$_{1.5}$Cu$_3$O$_y$", Jap. Jnl. Appl. Phys., vol. 27, No. 3, Mar. 1988, pp. L397–L399.

Izumi et al, "Crystal Structure of the Superconductor Ba$_{1.8}$Nd$_{1.2}$Cu$_3$O$_{7-y}$", Jap. Jnl. Appl. Phys., vol. 26, No. 10, Oct. 1987, pp. L1616–L1614.

Takeuchi et al, "Tunneling Measurements of Nd$_{1.85}$Ce$_{0.15}$CuO$_x$" Physical Review B, vol. 40, No. 13, Nov. 1, 1989, pp. 9286–9287.

Kosuge, "Preparation of an Almost Single Phase Superconductor in the Nd-Ce-Sr-Cu-O System", Jap. Jnl. Appl. Phys., vol. 28, No. 1, Jan. 1989, pp. L49–L51.

Akimitsu et al, "Superconductivity in the Nd-Sr-Ce-Cu-O System", Jap. Jnl. Appl. Phys., vol. 27, No. 10, Oct. 1988, pp. L1859–L1860.

Tokura et al, "A Superconducting Copper Oxide Compound with Electrons as the Charge Carriers", Nature, vol. 337, Jan. 26, 1989, pp. 345–347.

Akimitsu et al, "Successive Magnetic Phase Transitions in Nd$_2$CuO$_4$", Journal of the Physicl Society of Japan, vol. 58, No. 8, Aug. 1989, pp. 2646–2649.

Nucker et al, "Is Nd$_{2-x}$Ce$_x$CuO$_4$ an Electron-Superconductor?", Z. Phys. B.-Condensed Matter, vol. 75, Jun. 1989, pp. 421–422.

Tranquada et al, "Nature of the Charge Carriers in Electron-Doped Copper Oxide Superconductors", Nature, vol. 337, Feb. 23, 1989, pp. 720–721.

Primary Examiner—Paul Lieberman
Assistant Examiner—John Boyd
Attorney, Agent, or Firm—Sughrue, Mion, Zinn, Macpeak & Seas

[57] ABSTRACT

The disclosed superconducting oxide material has a crystal structure of either Nd$_2$CuO$_4$ type or oxygen-deficient perovskite type and mainly consists of a composition having a general chemical formula of $(R_{1-x}A_x)_{m+1}Cu_mO_{3m+1-y}$, R being at least one rare earth element selected from the group consisting of Pr, Nd, Sm, Eu, Gd, Dy, Tb, Ho, Er, Tm, Yb, and Lu, A being Ce or Th, m being an integer of 1, 2, 3, ... ∞ (m = ∞ standing for $(R_{1-x}A_x)CuO_{3-y}$), $0 \leq x \leq 1$, $0 \leq y \leq m$, Cu in the material having an average valence of not larger than +2 for all R, A, m, x, and y.

The disclosed superconducting oxide material may have a general chemical formula of Nd$_{2-x-z}$Ce$_x$Sr$_z$CuO$_{4-y}$, $0 \leq x \leq 1$, $0 \leq y \leq 1$, and $0 \leq z \leq 1$.

The above superconducting oxide material can be made by mixing powdery starting materials for the composition, sintering the mixture at 1,000° to 1,100° C. in air, and heat treating the sintered mixture at 900° to 1,100° C. in a reducing atmosphere (with an oxygen partial pressure of less than 10$^{-2}$ atm.)

1 Claim, 4 Drawing Sheets

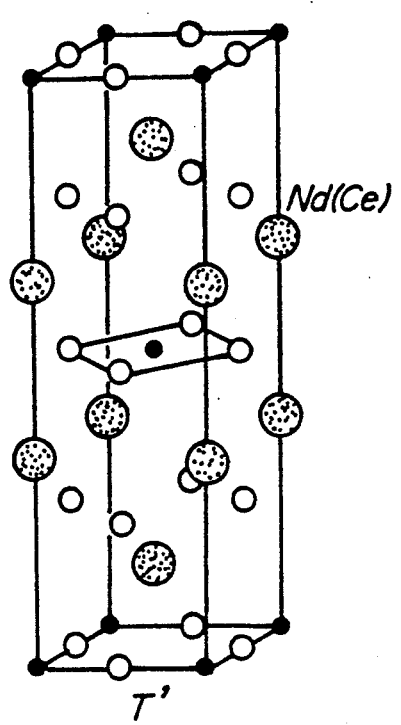
FIG._1A
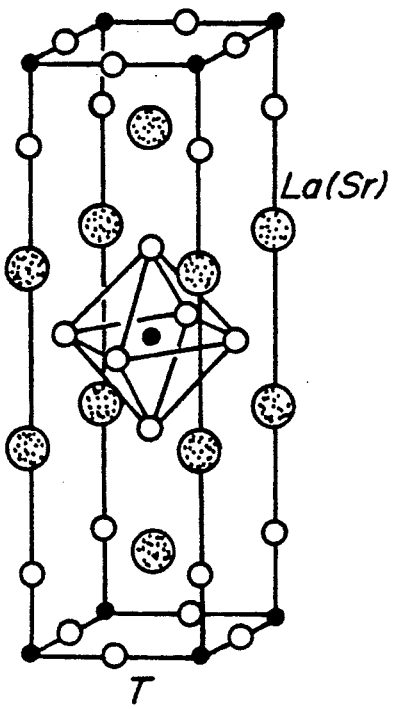
FIG._1B
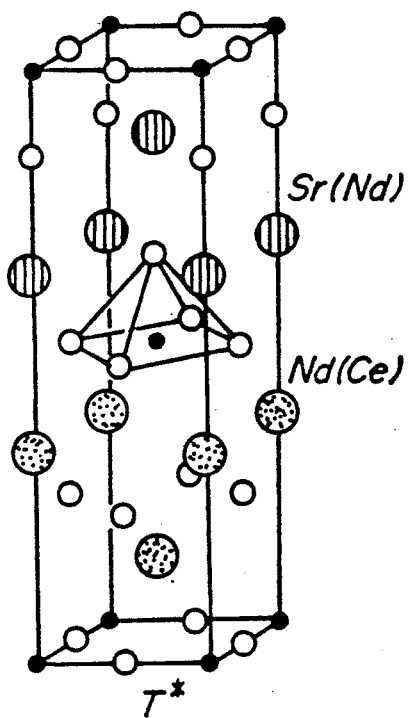
FIG._1C

METHOD FOR PRODUCING A R-CE-CU-O SUPERCONDUCTING MATERIAL WHEREIN R IS AT LEAST ONE RARE EARTH ELEMENT

This is a divisional of application Ser. No. 07/470,011 filed Jan. 25, 1990 now U.S. Pat. No. 5,143,895.

BACKGROUND OF THE INVENTION

1. Field of the Invention

This invention relates to superconducting oxide material whose electric resistance diminishes at a low temperature and a method for producing the same. The superconducting oxide material of the invention superconducts at a comparatively high temperature, e.g., the liquefying temperature of hydrogen or $-253°$ C. (20 K.), and it can be produced in a reducing atmosphere.

An object of the invention is to provide a material which is suitable for electronics elements, such as SQUIDs (Superconducting Quantum Interference Devices) and superconducting transistors, superconducting wires, and the like.

2. Related Art Statement

The occurrence of phenomenon of superconductivity has been known only at a very low temperature of 4-23 K., and its application has been limited to those fields where use of such very low temperature is economically justifiable. In 1986, rare each element-copper-oxide material was invented to make a great jump in the improvement of the transition temperature for superconductivity, and superconductivity is now available at a more readily accessible low temperature, e.g., the liquefying temperature of air.

Process which has been developed so far as the preparation of such superconducting oxide material uses a number of heat treating steps in an oxidizing atmosphere so as to introduce oxygen into the material. In producing electronics devices, thin film techniques under high vacuum is frequently used, and the need of heat treatment in the oxidizing atmosphere has been a major difficulty to be overcome before realizing the application of the superconducting oxide material to electronics. Further, in the case of superconducting wires for electric power transmission and storage, sheaths made of oxidization resisting noble metal, such as silver or platinum, have been used, and the use of costly noble metal has hampered popular application of the superconducting oxide material to power industries.

SUMMARY OF THE INVENTION

Therefore, an object of the present invention is to overcome the above-mentioned problems of the conventional oxide superconductors, by providing an improved superconducting oxide material which can be produced in vacuo or in a reducing atmosphere.

Another object of the invention is to develop n-type superconducting oxide material whose current carriers are electrons. Conventional oxide superconductors containing copper as a main ingredient are of p-type, and their current carriers are positive holes (i.e., holes left after release of electrons).

A superconducting oxide material according to the invention is of crystal structure of either $Nd_2CuO_4$ type or oxygen-deficient perovskite type, and mainly consists of a composition having a general chemical formula of $(R_{1-x}A_x)_{m+1}Cu_mO_{3m+1-y}$.

In the above general chemical formula, R is at least one rare earth element selected from the group consisting of Pr, Nd, Sm, Eu, Gd, Dy, Tb, Ho, Er, Tm, Yb, and Lu or a mixture thereof at an arbitrary ratio.

The symbol A in the above general chemical formula is either Ce or Th in the main, and it may contain one or more alkaline earth metals such as Ca, Sr, and Ba. The constant m being an integer of 1, 2, 3, ... ∞ (m=∞ standing for $(R_{1-x}A_x)CuO_{3-y}$).

The constant x and y are in the ranges of $0 \leq x \leq 1$, $0 \leq y \leq m$, preferably $0 \leq x \leq 0.2$, $0 \leq y \leq 0.2$.

For all combinations of elements represented by the symbols R and A, for all values of the constant m, and for all the above ranges of constants x and y, Cu in the material has an average valence of not larger than +2.

It is another object of the invention to provide a superconducting oxide material with a crystal structure of $Nd_2CuO_4$ type, or oxygen-deficient perovskite type, which material is synthesized in a reducing atmosphere and mainly consists of a composition having a general chemical formula of $Nd_{2-x-z}Ce_xSr_zCuO_{4-y}$, $0 \leq x \leq 1$, $0 \leq y \leq 1$, and $0 \leq z \leq 1$.

It is a further object of the invention to provide a method for producing a superconducting oxide material mainly consisting of a composition with a general chemical formula of $(R_{1-x}A_x)_{m+1}Cu_mO_{3m+1-y}$, R being at least one rare earth element selected from the group consisting of Pr, Nd, Sm, Eu, Gd, Dy, Tb, Ho, Er, Tm, Yb, and Lu, A being Ce or Th, m being an integer of 1, 2, 3, ... ∞ (m=∞ standing for $(R_{1-x}A_x)CuO_{3-y}$), $0 \leq x \leq 1$, $0 \leq y \leq m$, Cu in the material having an average valence of not larger than +2 for all R, A, m, x, and y, which method comprises steps of mixing powdery starting materials for the composition, sintering the mixture at 1,000° to 1,100° C. in air, and heat treating the sintered mixture at 900° to 1,100° C. in a reducing atmosphere (with an oxygen partial pressure of less than $10^{-2}$ atom.), so as to make crystal structure of the material into either $Nd_2CuO_4$ type or oxygen-deficient perovskite type.

In the present invention the phrase "mainly consisting of" means that the above-mentioned composition constitutes the major portion of the subject material and leaves the subject material open for the inclusion of such metal or composition which is different from the above-mentioned composition, provided that such inclusion does not cause any detrimental effects on the crystal structure and the purposes of the invention.

The material of the invention mainly consisting of the above-mentioned composition is an oxide and yet maintains good superconductivity even when its oxygen content is reduced unless its crystal structure is broken. Rather, reduction of oxygen content can improve the superconducting characteristics of the material as shown in the ensuing embodiments. Thus, the material of the invention is different from conventional oxide superconductor in that the superconducting material can be formed in an atmosphere with a low oxygen partial pressure or even in vacuo.

Important factors in the superconducting oxide material of the invention are as follows.

(1) The superconducting oxide material is a composition with a general chemical formula of $(R_{1-x}A_x)_{m+1}Cu_mO_{3m+1-y}$, and the material has crystal structure of either $Nd_2CuO_4$ type or oxygen-deficient perovskite type.

(2) In the above general chemical formula, R is at least one rare earth element selected from the group consisting of Pr, Nd, Sm, Eu, Gd, Dy, Tb, Ho, Er, Tm, Yb, and Lu, and preferably from the group consisting of Pr, Nd, Sm, Eu and Gd.

(3) In the above general chemical formula, A is either Ce or Th, and may contain at least one of alkaline earth metal of Ca, Sr, and/or Ba.

(4) In the above general chemical formula, m is an integer of 1, 2, 3, ... ∞.

(5) In the above general chemical formula, x and y are in the ranges of $0 \leq x \leq 1$, $0 \leq y \leq m$, preferably $0 \leq x \leq 0.2$, $0 \leq y \leq 0.2$.

(6) For all combinations of elements represented by the symbols R and A, for all values of m, and for all ranges of constants x and y, Cu in the material has an average valence of not larger than +2.

Examples of what is covered by the above general chemical formula are as follows.

$$(R_{1-x}A_x)_{m+1}Cu_mO_{3m+1-y} \quad (i)$$

$$Nd_{2-x-z}Ce_xSr_zCuO_{4-y} \quad (ii)$$

(for the case of R=Nd, A=Ce and Sr in formula (i))

$$Nd_{2-x}Ce_xCuO_{4-y} \quad (iii)$$

(for z=0 in formula (ii))

$$Nd_2CuO_{4-y} \quad (iv)$$

(for x=0 in formula (iii))

BRIEF DESCRIPTION OF THE DRAWINGS

For a better understanding of the invention, reference is made to the accompanying drawing, in which:

FIGS. 1A, 1B, and 1C are diagrammatic illustrations of the crystal structures in the T' phase, T phase, and T* phase, respectively. The T' phase, so called $Nd_2CuO_4$ type structure is the superconducting oxide material of the invention.

DESCRIPTION OF THE PREFERRED EMBODIMENTS

Ever since the discovery of high-temperature superconductivity of cuprate by George Bendnorz and Alex Muller, a large number of studies have been carried out to find out and clarify difficulties in obtaining a high critical transition temperature Tc (to be referred to as high-Tc, hereinafter). Prior studies in this field have found that there are several families of high-Tc cuprate, and such families have certain common characteristics; namely, laminar structure with two-dimensional arrays of octahedra or CuO pyramids which are doped with holes. The inventors have discovered a new superconducting cuprate doped with electrons (not doped with holes), which is a kind of breakthrough of the established chemical and physical theories on solid phase high-Tc cuprate.

The new superconducting material is a compound doped with, for instance, $Ce^{4+}$ and its general chemical formula is $Ln_{2-x}Ce_xCuO_{4-y}$, Ln being Pr, Nd, or Sm. This compound shows a T' phase structure, as shown in FIG. 1A for the case of $La_{2-x}Sr_xCuO_4$ (Tc=40 K.), and a T* phase structure, as shown in FIG. 1B for the case of $Nd_{2-x-z}Ce_xSr_zCuO_4$ (Tc=30 K.).

The so-called T' phase structure of $Nd_2CuO_4$ type in FIG. 1A consists of two-dimensional plane of Cu-O. As compared with the conventional superconducting copper oxide, this structure is characterized by lack of apex oxygen atoms.

Specimens of the material of the invention were prepared from a starting material which was a powdery mixture of CuO with compounds of rare earth elements such as those selected from the group of $CeO_2$, $Pr_6O_{11}$, $Nb_2O_3$, and $Sm_2O_3$. The powdery mixture was at first calcined at 950° C. for 10 hours in air, and shaped into pellets under pressure, and finally sintered at 1150° C. for 12 hours in air. The sintered pellets were cooled quickly in air to room temperature. To make the specimen superconducting, the pellets were doped with Ce in a reducing atmosphere and then annealed. In particular, the pellets were annealed at about 1,000° C. for 10 hours in a flow of $Ar/O_2$ gaseous mixture with an oxygen partial pressure of less than $10^{-3}$ atom, and cooled quickly in the same atmosphere to room temperature. The best result was obtained when the oxygen partial pressure was low, e.g., $8 \times 10^{-5}$ atom.

Figure 2:
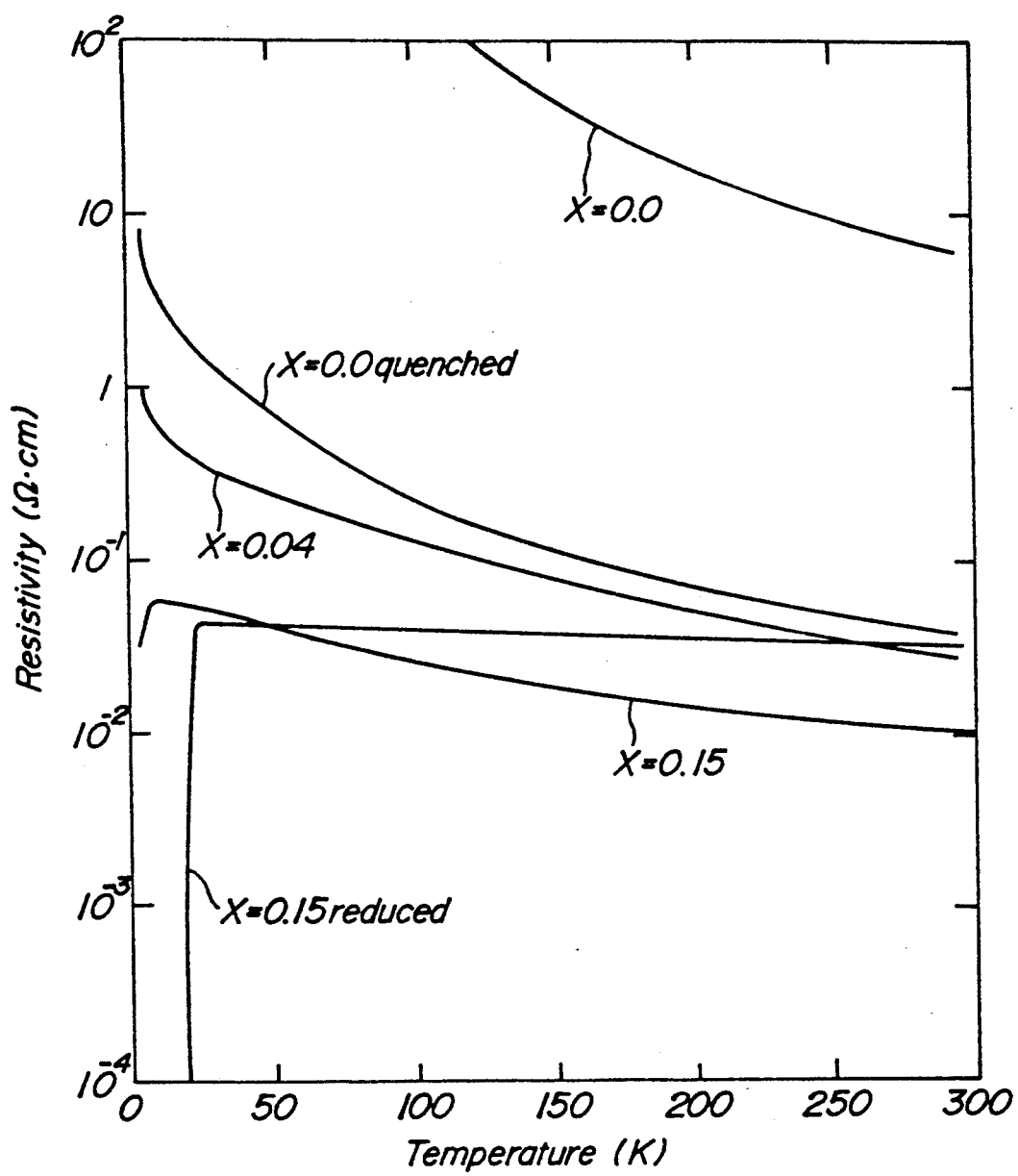
FIG. 2 shows temperature versus resistivity curves, indicating presence and absence of superconductivity in the material of the invention for the case of being quenched in air and for the case of being treated under reduced pressure.

FIG. 2 shows the temperature dependence of the resistance of $Nd_{2-x}Ce_xCuO_{4-y}$. The compound $Nd_2CuO_4$ before doping is a typical semiconductor, and doping the specimen with $Ce^{4+}$ makes it conductive. When the specimen was made oxidation-deficient (y being less than 0.04) by quickly cooling non-doped specimen from 1,150° C. to room temperature, considerable reduction of resistance was noticed. Observation of such fact suggests that the doped $Ce^{+4}$ and/or oxygen deficiency clearly indicates that electrons are introduced into the compound as charge carriers. According to recent studies, T' phase structure of Nd-based copper oxide cannot be doped with holes.

The T* phase structure of the compound $Nd_{2-x-z}Ce_xSr_zCuO_4$ as shown in FIG. 1C can be doped with holes like the T phase structure of FIG. 1B, but it cannot be doped with electrons. With the specimen of $Nd_{2-x}Ce_xCuO_{4-y}$, when the Ce concentration was 0.15, the specimen was semi-metallic and not superconducting, and a very low resistivity (less than $10^{-2}$ Ω.cm) was noted.

In FIG. 2, the specimen with x=0.15 showed a resistivity drop at about 9 K. This specimen shows superconductivity in small portions. In the same specimen with x=0.15, a remarkable superconductivity was acheived by the above-mentioned reduction process. Variation of resistance in response to magnetization indicated the start of becoming superconductive at about 24 K. The q number, which corresponds to electron concentration introduced per unit [Cu-O] or the effective Cu valence 2-q, was evaluated by iodomentry while considering reducing reaction between $Ce^{3+}$ and $Ce^{4+}$ in the titrating process. The specimen with x=0.15 in FIG. 2 showed the q value of 0.20 before the reducing treatment, and the q value of the superconducting specimen increased up to 0.28. This corresponds to the valence increment of oxygen at less than $y=0.07$. Thus, the increase of electron in excess of a certain value of density (q being less than 0.20) can be considered as an increase of superconductivity.

Electron type carriers in the new superconducting compound was confirmed by the measurement of Hall coefficient $R_H$.

A specimen $Nd_{1.85}Ce_{0.15}CuO_{0.93}$ with Tc at 24 K. showed negative Hall coefficients; namely, at 300 K., $R_H = -6.5 \times 10^{-4} \, cm^3/c$
at 80 K., $R_H = -2.3 \times 10^{-3} \, cm^3/c$ Such negative Hall coefficients provide contrasty difference of the material of the invention from conventional superconducting cuprate of hole type whose Hall coefficients are always positive.

Figure 3A:
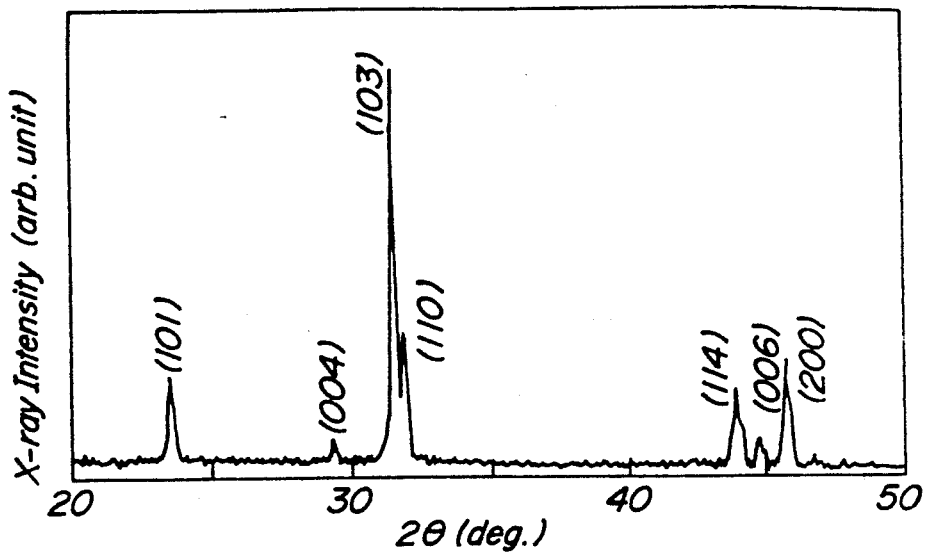
FIGS. 3A, 3B, and 3C are x-ray intensity curves obtained in x-ray diffraction tests on specimens of superconducting materials with structures shown in FIGS. 1A, 1B and 1C, respectively.
Figure 3B:
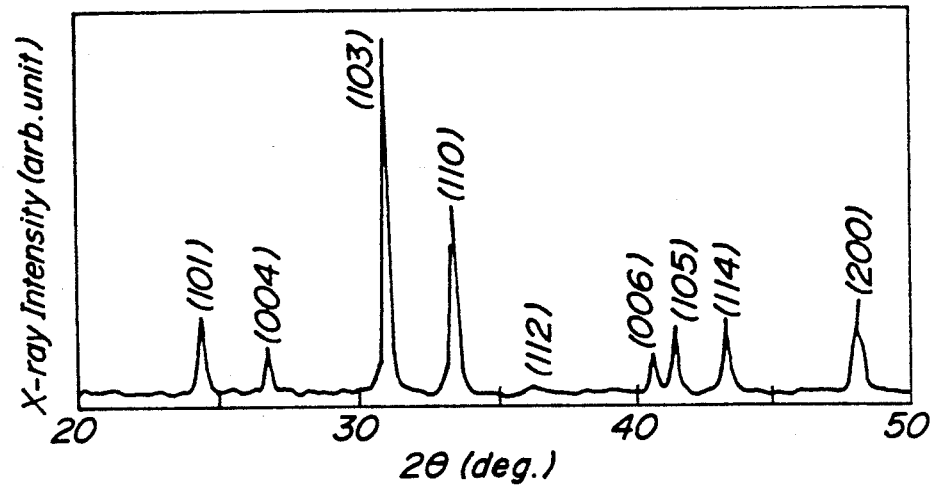
Figure 3C:
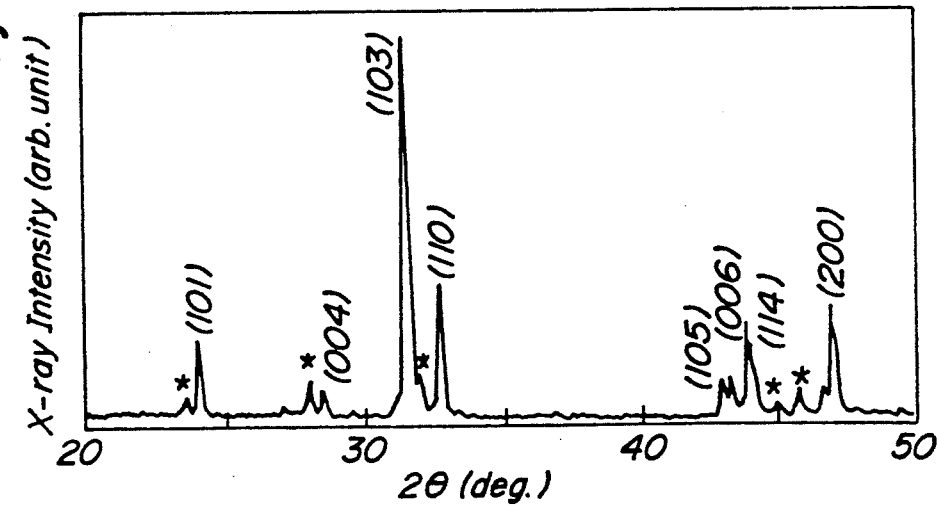

FIG. 3A shows the x-ray diffraction pattern of the specimen $Nd_{1.85}Ce_{0.15}CuO_{3.93}$. For comparison, similar x-ray diffraction pattern of the T phase structure of the hole type superconducting specimen $La_{1.85}Sr_{0.15}CuO_4$ of FIG. 1B is shown in FIG. 3B, and the x-ray diffraction pattern of the T* phase structure of the specimen $Nd_{1.4}Ce_{0.2}Sr_{0.4}CuO_4$ of FIG. 1C is shown in FIG. 3C.

Essentially, the x-ray diffraction pattern of the specimen $Nd_{1.85}Ce_{0.15}CuO_{0.93}$ of FIG. 3A coincides with the x-ray diffraction pattern of the T' structure of the compound before the doping of Ce. More specifically, all the recognizable diffraction peaks in FIG. 3A can be correlated to about the same lattice constants as those of T' phase structure ($a = 3.93$ Å, $c = 12.11$ Å) belonging to the typical tetragonal system having $a = 3.95$ Å and $c = 12.07$ Å. In the T phase structure of FIG. 3B, $a = 3.78$ Å and $c = 13.2$ Å, while in the T* phase structure of FIG. 3C, $a = 3.85$ Å and $c = 12.5$ Å. As compared with the lattice parameters of the T phase and T* phase structures having apex oxygen atoms bonded thereto, the T' phase structure has an expanded Cu-O plane and a shrunk axis thereof.

It should be emphasized here that the electron type superconductivity is not limited to Nd compounds alone. In the case of T' phase structures of other compounds such as cuprates of $Pr^-$ and $Sm^-$, the electron concentration may be increased in excess of 0.20 by Ce doping or by reducing treatment so as to expand the superconducting range to 20 K.

Figure 4:
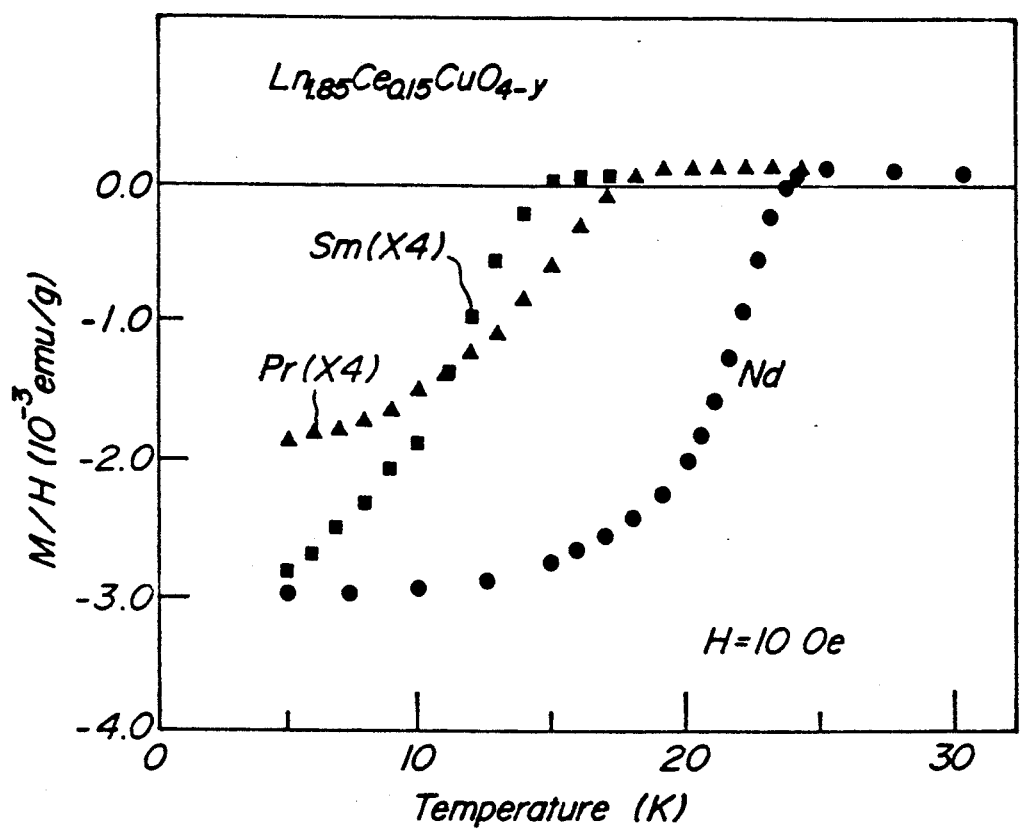
FIG. 4 is Meissner magnetization characteristics diagram of specimens of the superconducting oxide material of the invention ($Ln_{1.85}Ce_{0.15}CuO_{4-y}$, Ln being Pr, Nd, or Sm) for a certain range of absolute temperature T(K).

FIG. 4 shows the results of Meissner effect measurement on three different specimens of $Ln_{1.85}Ce_{0.15}CuO_4$ (Ln being Pr, Nd, and Sm, respectively) in a magnetic field of 10 Oe (while cooling in the magnetic field) by using a SQUID magnet meter. Meissner signals of considerable magnitude were measured in the series of the specimens.

In particular, $Nd_{1.85}Ce_{0.15}CuO_{3.93}$ produced a large signal (more than 25% of the theoretical value) which was related to a large superconductivity with a $Tc = 24$ K. As to the measured value of Tc, they were similar to the Tc of hole type superconducting cuprate of single layer; namely, $Tc = 28$ K. for T* phase structure of CuO pyramids, and $Tc = 40$ K. for T phase structure of CuO octahedra.

The $Pr_{1.85}Ce_{0.15}CuO_{4-y}$ compound specimen is the first example of Pr-cuprate. Of the hole-doped cuprates, Pr-cuprates such as the T* phase compound $Pr_{2-x-y}Ce_xSr_zCuO_{4-y}$ and the so-called 1-2-3 compound $PrBa_2Cu_3O_7$ show neither metallic behavior nor superconducting behavior. This is due to the partial trap of holes caused by the mixed valence (3+, 4+) of Pr ions.

The fact that the $Pr_{2-x-y}Ce_xSr_zCuO_{4-y}$ compound lacks superconductivity is another proof of the electron carriers in the superconduction of the T' compounds. In other words, $Pr^{3+}$ cannot be reduced further.

In short, the inventors discovered that a sheet of $CuO_2$ which is doped with electrons but free from apex oxygen atoms superconducts with an improved Tc of as high as 24 K. Such discovery provides a new decisive principle in the science of high-Tc superconductors, and it provides an important tool for analyzing the mechanism of high-Tc.

EMBODIMENTS

The invention will now be described in further detail by referring to embodiments, but the invention is not restricted by such embodiments.

Embodiment 1

Copper-oxygen compositions of the $(R_{1-x}A_x)_{m+1}Cu_mO_{3m+1-y}$ system were prepared while adjusting the ingredient concentrations in the ranges of $m=1$, $0 \leq x \leq 0.1$, $0 \leq y \leq 0.1$, R=Pr, Nd, Sm, and A=Ce.

More particularly, each of special class reagents $Nd_2O_3$, $CeO_2$, and CuO were measured and the measured amounts of them were mixed in an agate mortar, and the powdery mixture was placed in a crucible and pre-fired at 950° C. for five hours in air. The pre-fired mixture was pressed into pellets under a pressure of about 1,000 $kg/cm^2$, and the pellets were sintered at 1,100° C. for five hours in air. The thus sintered pellets were heat treated for five hours in an Argon-Oxygen mixed gas (with an oxygen partial pressure of $10^{-3}$ to $10^{-4}$ atom), and then quenched to room temperature in the same atmosphere.

X-ray diffraction tests were carried out on the sintered pellets and they proved to have the $Nd_2CuO_4$ type crystal structure.

Among the specimens thus prepared, those with a composition of Nd:Ce:Cu = 1.85:0.15:1.0, i.e., $x=0.075$, proved to begin the diminishing of electric resistance at 24 K. and to reach complete superconduction at 19 K. their diamagnetic magnetization under the complete superconduction reached more than the ideal value of 30%.

EFFECT OF THE INVENTION

The superconducting material of the invention can be applied to electronics elements, such as SQUIDs and superconducting transistors, superconducting wires, and the like. The material of the invention has the following advantages.

(a) The superconducting material can be produced in a reducing atmosphere. This is an important difference from conventional oxide superconductors.

(b) The superconducting material can be formed into thin films more easily than before thanks to the availability of the reducing atmosphere. Thin films are necessary in producing electronics elements.

(c) need of noble metals in the acid-resisting sheaths of superconducting wires can be eliminated and replaced with the material of the invention.

(d) The superconducting material can be prepared by using abundantly available rare earth elements such as Ce, Pr, and Nd.

(e) The superconducting material is of n-type, i.e., electrons are carriers of current. Conventional oxide superconductors are of p-type, i.e., holes are carriers of current. Thus, with the invention, both p-type and n- type oxide superconductors are available, and gate is now opened for development of multi-purpose superconducting electronics elements, as in the case of semiconductor materials.

Although the invention has been described with a certain degree of particularity, it is understood that the present disclosure has been made only by way of example and that numerous changes in details may be resorted to without departing from the scope of the invention as hereinafter claimed.

What is claimed is:

1. A method for producing a superconducting oxide material, the material consisting essentially of a composition having a general chemical formula of $$(R_{1-x}Ce_x)_{m+1}Cu_mO_{3m+1-y},$$

R being at least one rare earth element selected from the group consisting of Pr, Nd, Sm, Eu, Gd, Dy, Tb, Ho, Er, Tm, Yb, and Lu, m being an integer of 1, 2, 3, . . . ∞ (m=∞ standing for $(R_{1-x}A_x)CuO_{(3-y)}$), $0 \leq x \leq 1$, $0 \leq y \leq m$, and Cu in the material having an average valence of not larger than +2 for all R, A, m, x, and y, the method comprising mixing powdery starting materials for the composition, sintering the mixture at 1,000° to 1,100° C. in air, and heat treating the sintered mixture at 900° to 1,100° C. in a reducing atmosphere with an oxygen partial pressure of less than $10^{-2}$ atm., so as to form a crystal structure of either an $Nd_2CuO_4$ type or oxygen-deficient perovskite type.

* * * * *